(12) United States Patent
Schutzmann et al.

(10) Patent No.: US 8,387,879 B2
(45) Date of Patent: Mar. 5, 2013

(54) MAGNETIC SENSOR FOR CHECKING VALUE DOCUMENT

(75) Inventors: Jurgen Schutzmann, Pfaffenhofen (DE); Elisabeth Paul, Raubling (DE)

(73) Assignee: Giesecke & Devrient GmbH, Munich (DE)

( * ) Notice: Subject to any disclaimer, the term of this patent is extended or adjusted under 35 U.S.C. 154(b) by 0 days.

(21) Appl. No.: 13/133,247

(22) PCT Filed: Dec. 9, 2009

(86) PCT No.: PCT/EP2009/066709
§ 371 (c)(1),
(2), (4) Date: Jun. 7, 2011

(87) PCT Pub. No.: WO2010/066779
PCT Pub. Date: Jun. 17, 2010

(65) Prior Publication Data
US 2011/0233277 A1    Sep. 29, 2011

(30) Foreign Application Priority Data

Dec. 10, 2008 (DE) .......................... 10 2008 061 507

(51) Int. Cl.
*G06K 7/08* (2006.01)
(52) U.S. Cl. ......... 235/450; 235/435; 235/439; 235/494
(58) Field of Classification Search .................. 235/375, 235/379, 380, 435, 439, 449, 450
See application file for complete search history.

(56) References Cited

U.S. PATENT DOCUMENTS 6,822,443 B1 * 11/2004 Dogaru .......................... 324/235
2006/0196940 A1 * 9/2006 Kawai et al. .................. 235/449
2009/0008922 A1    1/2009 Schutzmann et al.
2010/0065639 A1    3/2010 Schutzmann et al.

FOREIGN PATENT DOCUMENTS

| DE | 2834287 | 2/1980 |
|----|---------|--------|
| DE | 102004049999 | 4/2006 |
| DE | 102006055170 | 5/2008 |
| WO | 9838792 | 9/1998 |

OTHER PUBLICATIONS

German Search Report in corresponding German Application No. 102008061507.2, dated Nov. 23, 2009.
International Search Report in PCT/EP2009/066709, Mar. 26, 2010.

* cited by examiner

*Primary Examiner* — Michael G Lee
*Assistant Examiner* — Matthew Mikels
(74) *Attorney, Agent, or Firm* — Bacon & Thomas, PLLC

(57) ABSTRACT

The invention relates to a magnetic sensor for checking documents of value and an apparatus and a method, wherein there are used a magnetization device for magnetizing a document of value and the magnetic sensor for detecting magnetic signals of the document of value. The magnetic sensor has two sensor lines which have several magneto-sensitive elements with different main sensitivity directions which are oriented in particular perpendicular to each other. The first sensor line selectively detects first magnetic areas of the document of value of a first coercive field strength and the second sensor line selectively detects second magnetic areas of the document of value of a second coercive field strength. Since the differently coercive magnetic areas of the document of value are detected independently of each other, there can be ascertained reliably and independently of each other two magnetic codings from differently coercive magnetic areas, which are arranged on the same document of value.

21 Claims, 5 Drawing Sheets

| | 12 | 14 |
|---|---|---|
| L1 | 0 | 0 |
| L2 | 0 | 1 |
| L3 | 0 | 0 |
| L4 | 0 | 0 |
| L5 | 1 | 0 |
| L6 | 0 | 0 |
| L7 | 0 | 0 |
| L8 | 1 | 1 |
| L9 | 1 | 1 |
| L10 | 0 | 0 |
| L11 | 0 | 0 |
| L12 | 0 | 0 |

MAGNETIC SENSOR FOR CHECKING VALUE DOCUMENT

BACKGROUND OF THE INVENTION

1. Field of the Invention

The invention relates to a magnetic sensor as well as an apparatus and a method for checking documents of value. The document of value can be bank notes, identity documents, check cards, credit cards, share certificates, deeds, stamps, checks, admission tickets, tickets, flight tickets, identification documents, visa stickers, labels, seals, packagings or other such elements. The simplifying term "document of value" in the following therefore always includes documents of the mentioned type.

2. Related Art

From the prior art it is known to provide documents of value with security elements, such as security strips or also security threads, which contain magnetic material. The magnetic material here can be applied to the security element either continuously or only in certain areas, for example in the form of a coding. For the magnetic coding of a security element there is used for example a certain sequence of magnetic and nonmagnetic areas, which is characteristic of the type of the document of value to be secured. Furthermore, it is known to use different magnetic materials for a magnetic coding, for example with different coercive field strengths. In the hitherto known magnetic codings there are used for example two differently coercive magnetic materials, from which there are formed two types of magnetic areas which can be arranged side by side or one above the other.

Furthermore, it is known to automatically check bank notes with security threads, which have a magnetic coding of differently coercive materials. Here, the bank notes are transported parallel to the course of the security element, and one after the other first go through a strong magnetic field parallel to the transport direction, which magnetizes both the high-coercive and also the low-coercive magnetic areas along the transport direction. The remaining magnetization is checked by means of an inductive magnetic head which is sensitive exclusively parallel to the transport direction. Then the bank notes go through a weaker magnetic field perpendicular to the transport direction, which orients only the low-coercive magnetic areas perpendicular to the transport direction, while the high-coercive magnetic areas remain magnetized in the transport direction. Again, the remaining magnetization is checked by means of an inductive magnetic head which is sensitive exclusively in parallel to the transport direction. Here, with the first inductive magnetic head there are detected the high- and the low-coercive magnetic areas and with the second inductive magnetic head there are detected only the high-coercive magnetic areas. If, however, differently coercive magnetic areas reach the detection area of the magnetic sensor at the same time, said magnetic sensor detects a superposition of the magnetic signals of the differently coercive magnetic areas. A disadvantage of this method is that magnetic areas which contain both high- and low-coercive magnetic material are difficult to distinguish from individual high-coercive or low-coercive magnetic areas.

SUMMARY OF THE INVENTION

The invention is therefore based on the object of providing a magnetic sensor with which documents of value which have differently coercive magnetic areas, in particular documents of value having magnetic codings of differently coercive magnetic materials, can be reliably recognized and differentiated from each other.

The apparatus according to the invention has a transport system by means of which a document of value, which is checked in the apparatus, is transported in the apparatus along a transport path. Along the transport path of the document of value there are arranged a first and a second magnetization section for magnetizing the document of value, which are provided for example through a magnetization device, and a magnetic sensor which detects magnetic signals of the document of value so as to determine the magnetization of the document of value. Here, the magnetization device is arranged, along the transport path, before the magnetic sensor.

The magnetic sensor according to the invention has a first and a second sensor line each containing several magneto-sensitive elements, in particular a line of magneto-sensitive elements of the same kind which are arranged along a line transverse, in particular perpendicular, to the transport direction of the document of value. The magneto-sensitive elements of the first sensor line each have the same main sensitivity direction. The magneto-sensitive elements of the second sensor line each also have the same main sensitivity direction. The magneto-sensitive elements of the first sensor line have a first main sensitivity direction and the magneto-sensitive elements of the second sensor line have a second main sensitivity direction which is different from the first main sensitivity direction. For example, the first and the second main sensitivity direction are oriented perpendicular to each other and lie in the transport plane of the document of value. Substantially, the magneto-sensitive elements detect only magnetic fields, whose direction points along the main sensitivity direction of the respective magneto-sensitive element. Magnetic fields oriented perpendicular thereto do not produce a magnetic signal or an only weak magnetic signal whose level is below a predetermined threshold value. The magneto-sensitive elements thus substantially detect magnetic signals of magnetic areas, whose magnetization is oriented parallel or antiparallel to the main sensitivity direction of the respective magneto-sensitive element.

The magneto-sensitive elements are preferably arranged along the first or second sensor line respectively in such a way that no gaps, if possible, or gaps as small as possible remain there between. Furthermore, the magneto-sensitive elements of the two sensor lines are preferably arranged to each other in such a way that a respective magneto-sensitive element of the first sensor line corresponds with a magneto-sensitive element of the second sensor line, i.e. that past these two magneto-sensitive elements there is transported substantially the same partial area of the document of value. The respective two mutually corresponding magneto-sensitive elements define one measuring track. For the first and second sensor line, as magneto-sensitive elements there can be used for example magneto-resistive elements, inductive elements or Hall elements.

Preferably, the magneto-sensitive elements of the first and second sensor line are formed as magneto-resistive elements. The magneto-resistive elements can be magnetically biased by a bias magnetic field in order to set a suitable operating point on the resistance characteristic thereof. At least one direction component of the bias magnetic field is here oriented parallel or antiparallel to the main sensitivity direction of the respective magneto-resistive element to be magnetically biased. For realizing the small magnetic bias there can be arranged a permanent magnet or a current-carrying electrical conductor near the respective magneto-resistive element in such a way that by the permanent magnet or upon current flowing through the conductor there is generated a bias magnetic field which magnetically biases the magneto-resistive elements. For example, the magneto-resistive elements of the first and second sensor line are configured as GMR elements (GMR: giant magneto-resistance), but they can also be configured as AMR elements (AMR: anisotropic magneto-resistance), TMR elements (tunnelling magneto-resistance), SdT elements (spin-dependent tunnelling), spin-valve elements or as conventional magneto-resistance elements, which function on the basis of the ordinary magneto-resistance, or as other magneto-resistive elements. If as magneto-resistive elements of the first and second sensor line there are used GMR, AMR, TMR, SdT or spin-valve elements, these are preferably slightly magnetically biased, the magnetic field strength of the slight magnetic bias is smaller than 8 kA/m, in particular smaller than 5 kA/m. GMR elements may have, for example, a layer system of ferromagnetic and nonmagnetic metal layers, which has a meandering structure. The main sensitivity direction of the GMR elements is defined here by the longitudinal direction of the meandering structure. In conventional magneto-resistance elements the main sensitivity direction is oriented for example perpendicular to the plane of the magneto-resistance layer.

The magnetic sensor can be arranged, upon viewing along the transport path, at any point after the magnetization device. In some embodiment examples, the magnetic sensor and the magnetization device are arranged, along the transport path, spatially separated from each other, the magnetic sensor and the magnetization device for example being installed in the apparatus spatially separated from each other. In case of limited space in the apparatus, it may be advantageous to dispose the magnetization device and the magnetic sensor not in direct succession, but each at a place where the corresponding space is available within the apparatus. The spatially separated arrangement allows more flexibility in the arrangement of the two components within the apparatus. Furthermore, the magnetization device can then be installed independently of the magnetic sensor. With a correspondingly large space in the apparatus, the magnetization device and the magnetic sensor, however, can also be arranged in direct succession along the transport path. Here, they can also be installed as two components separated from each other, or, alternatively, within the same component, in particular in a joint housing.

The document of value is transported along the transport path in a transport direction which at different positions along the transport path may point in different spatial directions. Upon the transport of the document of value, the document of value spans a transport plane which at different positions along the transport path may take on different spatial orientations, such as e.g. in the case of diversions of the transport path. In this application, indications of direction which refer to the main sensitivity direction of the magneto-sensitive elements of the sensor lines or the magnetization directions of the magnetization sections and which are stated with regard to the transport direction or to the transport plane always relate to the respective transport direction or to the respective transport plane of the document of value at the location of the respective sensor line or at the location of the respective magnetization section.

After the document of value was magnetized by the magnetization sections, the orientation of the magnetization direction in space may change along the transport path, due to changes in the transport direction. Since the magnetization is a physical property of the magnetized document of value, however, the orientation of the magnetization with respect to the document of value remains the same also upon diversions of the transport path. At the position of the respective sensor line, the direction of the magnetization which a transported document of value carries is thus defined by the transport orientation of the transported document of value. If in the following the main sensitivity direction of a sensor line is put in relation to the magnetization direction, e.g. that these are parallel to each other, this means that the main sensitivity direction is put in relation to the direction of the magnetization of the document of value at the position of the respective sensor line.

For magnetizing the document of value, the document of value is transported along the transport path through two magnetization sections successively. First, the document of value is transported through a first magnetization section which is configured to magnetize the document of value in a first magnetization direction, and thereafter through a second magnetization section which is configured to magnetize the document of value in a second magnetization direction and which is arranged after the first magnetization section. In some embodiment examples, the second magnetization section is arranged directly after the first magnetization section. The magnetic field strength of the first magnetization section, which is referred to as first magnetic field strength, is greater than the magnetic field strength of the second magnetization section, which is referred to as second magnetic field strength. The first magnetic field strength is greater, preferably by at least a factor 1.5, preferably by at least a factor 5, in particular by at least a factor 10, than the second magnetic field strength. The first magnetization direction is preferably oriented perpendicular to the second magnetization direction. Furthermore, the magnetization directions of the first and second magnetization section preferably lie in the transport plane of the document of value. For example, the first magnetization direction is oriented parallel to the transport direction of the document of value and the second magnetization direction perpendicular to the transport direction. Alternatively, the first magnetization direction can be oriented perpendicular to the transport direction of the document of value and the second magnetization direction parallel to the transport direction.

Preferably, at least the first or the second main sensitivity direction is oriented parallel or antiparallel to the first or to the second magnetization direction. In some embodiment examples, the first main sensitivity direction is oriented parallel or antiparallel to the first or to the second magnetization direction, and the second main sensitivity direction is oriented parallel or antiparallel to the other of these magnetization directions. That is, the first main sensitivity direction is oriented parallel or antiparallel to the first magnetization direction and the second main sensitivity direction in parallel or antiparallel to the second magnetization direction, or vice versa. In other embodiment examples, the first main sensitivity direction is oriented parallel or antiparallel to the first or second magnetization direction and the second main sensitivity direction is oriented perpendicular to the first and perpendicular to the second magnetization direction. As already mentioned above, the first and second magnetization direction is a physical property of the document of value. The spatial orientation of the first and second magnetization direction at the position of the sensor lines is thus defined by the spatial orientation of the document of value.

For example, the first or second main sensitivity direction is oriented parallel to the transport plane and perpendicular to the transport direction, while the second or first main sensitivity direction is oriented parallel to the transport direction or perpendicular to the transport plane. Alternatively, the first or second main sensitivity direction can be oriented parallel to the transport direction or perpendicular to the transport plane, while the second or first main sensitivity direction can be oriented parallel to the transport plane and perpendicular to the transport direction.

In some embodiment examples, the magnetic sensor has, in addition to the first and second sensor line, a third sensor line which has several magneto-sensitive elements with a third main sensitivity direction. The third main sensitivity direction can be oriented parallel to the first or parallel to the second main sensitivity direction. Alternatively, the third main sensitivity direction can also be oriented perpendicular to the first and perpendicular to the second main sensitivity direction.

Furthermore, the apparatus according to the invention may have a further magnetization section which provides a further magnetic field for magnetizing the document of value. In particular, the further magnetization section is provided through the magnetic sensor. The further magnetization section is arranged in close proximity to the first, to the second or to the third sensor line and is configured to magnetize, at the time of the detection by the respective (first, second or third) sensor line, the document of value transported past. For example, in the further magnetization section there are not only arranged the document of value transported past, but also the magneto-sensitive elements of the respective (first, second or third) sensor line. The respective (first, second or third) sensor line can thus detect the magnetization of the document of value under the influence of the further magnetic field. In this way, the respective (first, second or third) sensor line can also detect magnetic material of low remanence, such as e.g. soft-magnetic material of the document of value transported past. Preferably, the magnetization direction of the further magnetization section is oriented parallel to the first or to the second magnetization direction or perpendicular to the first and to the second magnetization direction.

The further magnetization section is arranged for example in close proximity to the third sensor line and configured to magnetize, during the detection by the third sensor line, the document of value transported past. Here, for magnetizing the document of value there is used for example a magnetic field strength of the further magnetization section of at least 16 kA/m. In some embodiment examples, as magneto-sensitive elements of the third sensor line, which detects the document of value under the influence of the further magnetic field, there are used magneto-resistive elements which are configured as GMR, AMR, TMR, SdT or spin-valve elements. In this case, the magnetization direction of the further magnetization section is preferably oriented perpendicular to the main sensitivity direction of the magneto-resistive elements of the third sensor line. In other embodiment examples, as magneto-sensitive elements of the third sensor line, which detects the document of value under the influence of the further magnetic field, there are used magneto-resistive elements which are configured as conventional magneto-resistance elements. In this case, the magnetization direction of the further magnetization section is preferably oriented parallel to the main sensitivity direction of the magneto-resistive elements of the third sensor line, i.e. of the conventional magneto-resistance elements. In these embodiment examples, through the further magnetic field of the further magnetization section there is magnetized the document of value, on the one hand, and there is generated a magnetic bias of the conventional magneto-resistance elements of the third sensor line parallel to their main sensitivity direction, on the other hand. For magnetizing the document of value and for biasing the conventional magneto-resistance elements there is preferably used a magnetic field strength of the further magnetization section of at least 16 kA/m.

In another embodiment example, already the first or the second sensor line is arranged in the second magnetization section. For example, along the transport path there can first be arranged a magnetization device which provides the first magnetization section, and after that the magnetic sensor in which there are accommodated both the second magnetization section and the two sensor lines. In the second magnetization section there is arranged that first or second sensor line which the document of value is transported past first along the transport path. The magnetic field of the second magnetization section causes a magnetization of the document of value transported past, while the document of value is detected by this first or second sensor line. In particular, this first or second sensor line has magneto-resistive elements which are configured as GMR, AMR, TMR, SdT or spin-valve elements and whose main sensitivity direction is oriented perpendicular to the second magnetization direction of the second magnetization section.

The magnetic sensor according to the invention and the apparatus according to the invention can be used to check a document of value which contains two magnetic materials of different coercive field strength, in particular a document of value which has a security element with differently coercive magnetic areas. For example, the document of value, in particular the security element, has at least one first magnetic area with a first coercive field strength and at least one second magnetic area with a second coercive field strength, the first coercive field strength being greater than the second coercive field strength. Preferably, the first and second coercive field strength differ by a factor of at least 1.5, preferably by at least a factor 5, particularly preferably by at least a factor 10. In the following, the first magnetic areas are also referred to as high-coercive magnetic areas and the second magnetic areas as low-coercive magnetic areas. In the present application, the terms high-coercive or low-coercive magnetic material always refer to high-coercive or low-coercive magnetic material, which has—without external magnetic field—a significant remanent magnetization which can be usually detected with magnetic sensors for checking documents of value. In particular, the said high-coercive or low-coercive magnetic materials are hard-magnetic magnetic materials with relatively high or relatively low coercive field strength.

In a special embodiment, the first and second magnetic area have about the same remanent magnetization. The differently coercive magnetic areas contain in particular different magnetic pigments, e.g. different iron compounds, such as iron oxides, magnetite or barium ferrite. The one or more first and second magnetic areas can be arranged on the document of value, in particular on the security element, spaced apart from each other, but they can also be arranged adjacent to each other, overlapping each other or also one above the other. The differently coercive magnetic areas form for example two magnetic codings independent of each other. Furthermore, the document of value may have soft-magnetic areas which can be applied onto the document of value e.g. by means of magnetic printing ink or which are incorporated into the substrate of the document of value.

For checking the document of value, the document of value is transported along a transport path, in particular in an apparatus for processing documents of value, the following steps being carried out:

The document of value at first is transported through a first magnetization section having a first magnetic field strength which is greater than the coercive field strengths of the two differently coercive magnetic areas of the document of value, i.e. greater than the first and than the second coercive field strength. The first magnetization direction of the first magnetization section can be selected arbitrarily, but preferably lies in the transport plane of the document of value. The magnetic field of the first magnetization section magnetizes both the high-coercive and the low-coercive magnetic areas in the first magnetization direction.

After that, the document of value is transported through a second magnetization section with a second magnetic field strength which lies between the coercive field strengths of the two differently coercive magnetic areas. The second magnetic field strength is therefore smaller than the first coercive field strength, but greater than the second coercive field strength. The second magnetization direction of the second magnetization section is oriented perpendicular to the first magnetization direction and lies preferably also in the transport plane of the document of value. The magnetic field of the second magnetization section turns only the magnetization of the low-coercive magnetic areas from the first magnetization direction in the second magnetization direction, while the magnetization of the high-coercive magnetic areas is not changed by the magnetic field of the second magnetization section, leaving the high-coercive magnetic areas magnetized in the first magnetization direction.

In the further course of the processing of the document of value, the document of value is transported past the magnetic sensor according to the invention, which is configured to detect the magnetization of the document of value and which has at least one first and one second sensor line with different main sensitivity directions, in particular oriented perpendicular to each other. The detection of the magnetization of the document of value with the help of the magnetic sensor can be effected directly after the magnetization of the document of value or later in the further course of the processing of the document of value. The order of the first and second sensor line along the transport path can be selected arbitrarily here.

The first coercive field strength amounts to for example at least 40 kA/m, the second coercive field strength for example to at least 20 kA/m, however, the latter, always lying below the first coercive field strength. The first magnetic field strength of the first magnetization section is preferably at least a factor 1.5 greater than the first and than the second coercive field strength, i.e. at least 1.5 times greater than the coercive field strengths of the high- and the low-coercive magnetic areas. The second magnetic field strength of the second magnetization section is smaller than the first coercive field strength, i.e. than the coercive field strength of the high-coercive magnetic areas, but preferably at least a factor 1.5 greater than the second coercive field strength, i.e. than the coercive field strength of the low-coercive magnetic areas. Moreover, the first and second coercive field strength are chosen such that these, if for the magneto-resistive elements of the first and second sensor line a bias magnetic field is used, are greater than the magnetic field strength of this bias magnetic field.

The first or the second sensor line selectively detects the magnetic signals of the first magnetic areas having the first coercive field strength (high-coercive magnetic areas), the other sensor line, i.e. the second or first sensor line, selectively detects the magnetic signals of the second magnetic areas having the second coercive field strength (low-coercive magnetic areas). The magnetic signals of the first and the magnetic signals of the second sensor line provide information about the arrangement of the high-coercive or about the arrangement of the low-coercive magnetic areas on the document of value, in particular on the security element. Since the high-coercive and low-coercive magnetic areas are detected selectively and thus independently of each other, with the help of the invention there can be ascertained independently of each other two magnetic codings from differently coercive magnetic areas, which are arranged on the same document of value, in particular on the same security element. In particular, in this way there can be detected and recognized independently of each other a first magnetic coding, which is formed by high-coercive magnetic areas, and a second magnetic coding, which is formed by low-coercive magnetic areas. From the magnetic signals of the magnetic sensor there can thus be ascertained one or more magnetic codings of the document of value. The magnetic codings can in particular be provided for the determination of the type of the document of value, e.g. the denomination, and/or the authenticity of the document of value.

Furthermore, by the magnetic sensor according to the invention there can also be recognized combined magnetic areas of the document of value, which have both high- and low-coercive magnetic material, and reliably distinguished from the high- and low-coercive magnetic areas. In the combined magnetic area, the high- and the low-coercive magnetic material can be contained for example in a mixed fashion. Alternatively, in the combined magnetic area there can be arranged high- and low-coercive magnetic areas one above the other. These combined magnetic areas can be distinguished from the other magnetic areas, which either have high-coercive or low-coercive magnetic material, in that in this case both mutually corresponding magneto-sensitive elements of the respective measuring track detect magnetic signals, while in the case of the individual high- or low-coercive magnetic areas in each case only one of the two corresponding magneto-sensitive elements of the two sensor lines detects magnetic signals. Since the high-coercive and the low-coercive magnetic areas are selectively detected with only one of the sensor lines in each case and the combined magnetic areas are detected by both sensor lines, said different magnetic areas can be reliably distinguished from each other. With the help of the magnetic signals of the first sensor line and of the second sensor line there is checked the presence and/or the arrangement of the first (high-coercive) magnetic areas and of the second (low-coercive) magnetic areas and, if any, of the combined magnetic areas on the document of value.

The sensor lines preferably have a plurality of measuring tracks, with which there can be detected in a spatially resolved manner the arrangement of the differently coercive magnetic areas perpendicular to the transport direction. In this way, there can be recognized for example a magnetic coding of a security element extending transversely to the transport direction, such as e.g. the magnetic coding of a security thread in the case of a transport direction of the document of value along its longitudinal direction. The spatial resolution lies e.g. in the range of one or several millimeters. The apparatus according to the invention, however, can also be used to detect the arrangement of the differently coercive magnetic areas on the document of value parallel to the transport direction. In this case, the differently coercive magnetic areas generate magnetic signals in temporal succession at the sensor lines, from which there can be determined, with the help of the transport speed of the document of value, the spatial arrangement of the differently coercive magnetic areas along the transport direction. In this way, there can be recognized for example a security element's magnetic coding extending in parallel to the transport direction, such as e.g. a security thread, in particular when the document of value is transported along its shorter side.

Optionally, the document of value may pass, after the detection of the magnetic signals by the sensor lines of the magnetic sensor, through a deactivating magnetic field, by which the magnetization of the magnetic areas is deleted or again changed. For this purpose, in the apparatus for processing documents of value there can be provided after the sensor lines e.g. a demagnetization device, which acts upon the document of value with an electromagnetic alternating field, or a deactivating magnet of high magnetic field strength which orients the magnetization of all magnetic areas of the document of value into a certain direction.

Examples of the security element, which contains the differently coercive magnetic areas, are a security element, a planchette or a label which are applied or incorporated on or in the document of value. Alternatively, the first and/or second and/or combined magnetic areas may also be contained on or in the document of value independently of a security element, e.g. the first and/or second and/or combined magnetic areas can be printed onto the document of value or be contained in the substrate of the document of value.

The apparatus can be e.g. a sorting apparatus for documents of value, or also a pay station, a vending machine, an input apparatus, an output apparatus or an input and output apparatus for documents of value, in particular a recycling apparatus for documents of value, etc.

DESCRIPTION OF THE DRAWINGS

Further embodiment examples and advantages of the invention are explained in the following with reference to the Figures as well as the description thereof.

DETAILED DESCRIPTION OF PREFERRED EMBODIMENTS OF THE INVENTION

Figure 1:
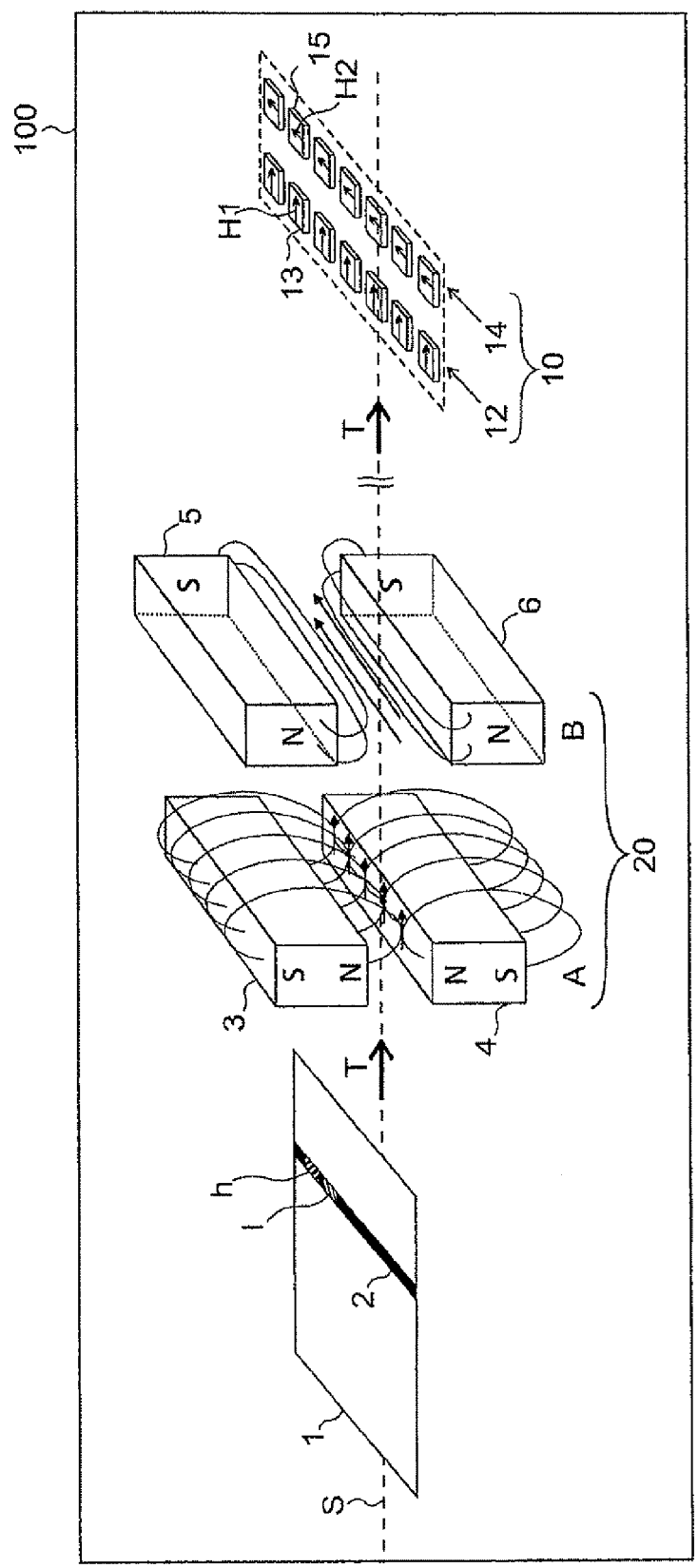
FIG. 1 shows a first embodiment example of the invention with a magnetization device which is arranged spatially separated from the magnetic sensor.

FIG. 1 shows a first embodiment example in which a document of value 1 is transported, along a transport path S, at first past a magnetization device 20 having two magnetization sections A, B, and then past a magnetic sensor 10 having two sensor lines 12, 14. The magnetization sections A, B in this embodiment example are provided by two mutually opposing magnets 3, 4 or 5, 6, respectively, between which the document of value 1 is transported through. The poles of the magnets 3, 4 are oriented such that in the magnetization section A there results a magnetic field in parallel to the transport direction T. At the beginning of the magnetization section A, upon this arrangement of the magnets 3, 4, there may be formed an antiparallel magnetic field, which may lead to a preceding, additional magnetic reversal of the document of value, which, however, has no influence on the magnetization resulting after the magnetization section A. The poles of the magnets 5, 6 are oriented such that in the magnetization section B there results a magnetic field perpendicular to the transport direction T. Due to the smaller distance of the magnets 3, 4 compared to the magnets 5, 6, the magnetic field strength of the magnetization section A is greater than the magnetic field strength of the magnetization section B, for example by a factor of at least 1.5. Alternatively, the distances of the magnets 3, 4 and of the magnets 5, 6 can also be chosen to be equally great and the strength of the magnets 3, 4 and 5, 6 can be chosen corresponding to the respectively desired magnetic field strength of the magnetization sections A, B. The magnetic fields of the magnetization sections A, B, alternatively, of course can be generated using other types of magnets or by using current-carrying electrical conductors. Instead of two opposing magnets, for providing a magnetization section there can also be used e.g. a single magnet which is arranged only on one side of the document of value 1 transported past. The shown arrangement is contained in an apparatus 100 for processing documents of value, in which the documents of value 1 are inputted individually or in stacks, then are checked, sorted and stored in the apparatus 100 or again outputted. The document of value 1 shown in FIG. 1 has a security element 2 with a magnetic coding which is formed by magnetic areas of a high-coercive magnetic material and magnetic areas of a low-coercive magnetic material. By way of example, in FIG. 1 there is shown only one high-coercive magnetic area h and one low-coercive magnetic area l.

The first magnetization section A has a magnetic field with great magnetic field strength oriented parallel to the transport direction T of the document of value 1, the magnetic field strength being chosen such that it is greater than the coercive field strengths of both magnetic materials of the security element 2. Through the first magnetization section A, both the high-coercive magnetic areas and the low-coercive magnetic areas of the security element 2 are magnetized, the (first) magnetization direction being oriented parallel to the transport direction T of the document of value 1. The second magnetization section B of the magnetization device 20 has a magnetic field with lower magnetic field strength oriented perpendicular to the transport direction T of the document of value 1, the magnetic field strength being chosen such that it lies between the coercive field strengths of the two magnetic materials of the security element 2. The magnetic field of the second magnetization section B magnetically reverses only the low-coercive magnetic areas, namely in a (second) magnetization direction perpendicular to the transport direction T, while the magnetization of the high-coercive magnetic areas remains oriented parallel to the transport direction.

In the further course of the processing of the document of value in the apparatus 100, the document of value 1 is transported past the magnetic sensor 10, which in this embodiment example is installed in the apparatus 100 separate from the magnetization device 20. There between, there can be provided e.g. branchings or diversions of the transport path S. The magnetic sensor 10 contains two sensor lines 12, 14 each having a plurality of magneto-sensitive elements 13, 15 of the same type arranged in a line. In this example, the magneto-sensitive elements are configured as magneto-resistive elements 13, 15, but instead there can also be used inductive elements, Hall elements, etc. The sensor lines 12, 14 are arranged in close proximity to the transport plane of the document of value 1. It can be provided that the documents of value 1 transported past touch the surface of the sensor lines 12, 14, but there can also be provided a small distance between the surface of the sensor lines 12, 14 and the document of value 1 transported past, e.g. a distance in the millimeter range. The magneto-resistive elements 13 of the first sensor line 12 have a main sensitivity direction H1, which is oriented parallel to the transport direction T and thus parallel to the magnetization direction of the magnetization section A, while the magneto-resistive elements 15 of the second sensor line 14 have a main sensitivity direction H2 which is oriented perpendicular to the transport direction T and thus parallel to the magnetization direction of the magnetization section B. The main sensitivity directions H1 and H2 are shown in FIG. 1 by arrows on the respective magneto-resistive elements 13 or 15. Along the transport path S, the first sensor line 12 can be arranged, as shown in FIG. 1, before the second sensor line 14, alternatively, however, the first sensor line 12 can also be arranged after the second sensor line 14.

The security element 2 of the document of value 1, which was magnetized in the manner described above by the magnetization device 20, is then transported past the two sensor lines 12, 14 which gather magnetic signals in order to detect the magnetization of the security element 2. The magneto-resistive elements 13, whose main sensitivity direction H1 is oriented parallel to the magnetic field of the magnetization section A, detect magnetic signals of the high-coercive magnetic areas h magnetized parallel to H1. The low-coercive magnetic areas 1, which are magnetized perpendicular to H1, generate at the magneto-resistive elements 13 an only negligibly small magnetic signal. The magneto-resistive elements 15, whose main sensitivity direction H2 is oriented parallel to the magnetic field of the magnetization section B, detect magnetic signals of the low-coercive magnetic areas 1 magnetized parallel to H2. The high-coercive magnetic areas h, which are magnetized perpendicular to H2, generate at the magneto-resistive elements 15 an only negligibly small magnetic signal. With the first sensor line 12 thus there are selectively detected the magnetic signals of the high-coercive magnetic areas and with the second sensor line 14 there are selectively detected the magnetic signals of the low-coercive magnetic areas. With the help of the magnetic signals of the first sensor line 12, the arrangement of the high-coercive magnetic areas on the security element 2 can be determined and, independent thereof, with the help of the magnetic signals of the second sensor line 14, the arrangement of the low-coercive magnetic areas on the security element 2.

Figure 2A:
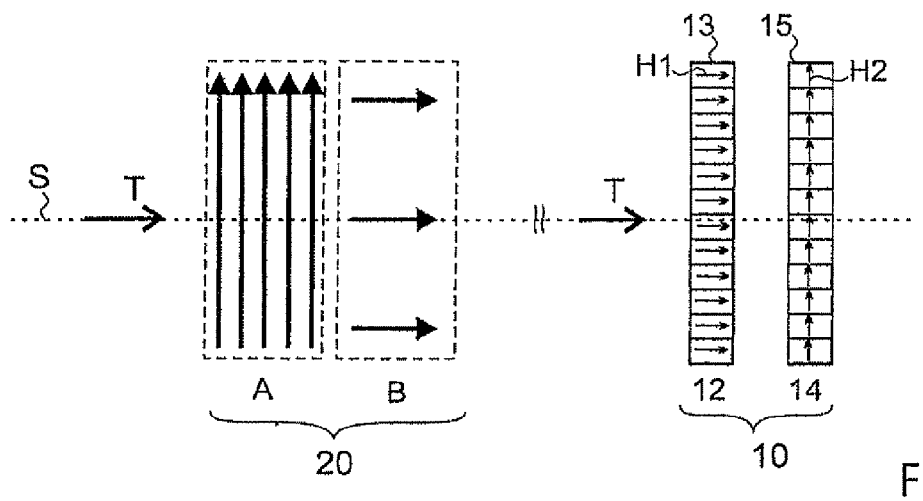
FIGS. 2a-c show schematic representation of three further embodiment examples in a plan view of the transport plane of the document of value.
Figure 2B:
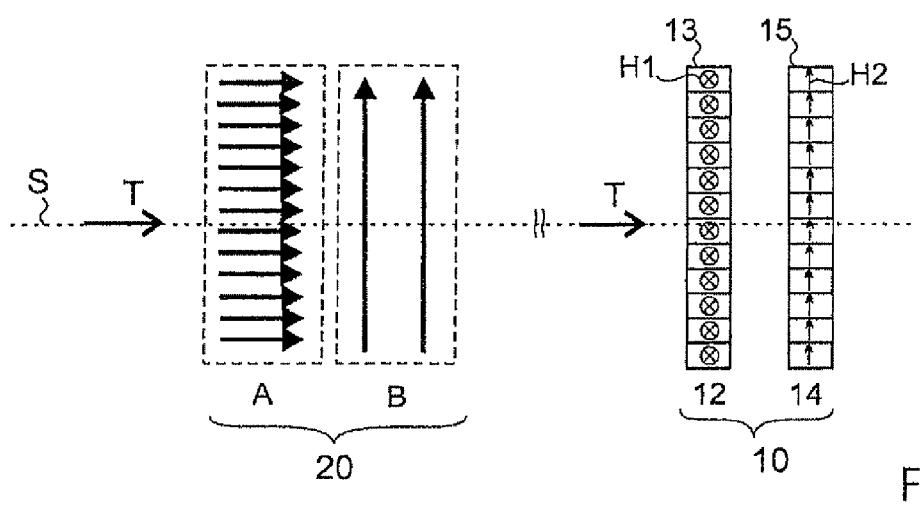
Figure 2C:
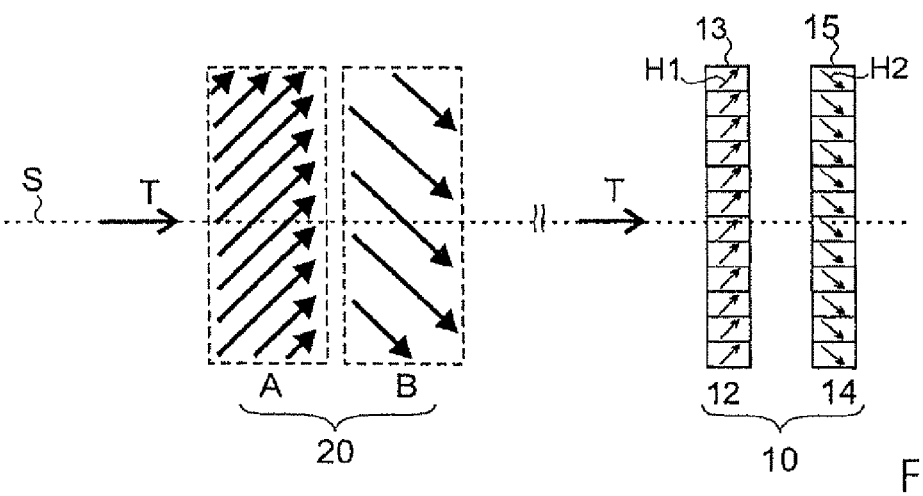

In the FIGS. 2a-c there are shown three further embodiment examples, in each case there being schematically represented the magnetization sections A and B of the magnetization device 20 and the two sensor lines 12 and 14 of the magnetic sensor 10 in a plan view of the transport plane of the document of value 1 and the orientations thereof in relation to the transport path S. Along the transport path S there is transported a document of value 1 which has one or more high-coercive and low-coercive magnetic areas, which may be arranged on the document of value 1 e.g. side by side and/or one above the other. There is shown only that portion of the magnetization sections A, B which lies in the transport plane of the document of value 1, the respective magnetization direction and the respective magnetic field strength being illustrated with the help of magnetic field lines. A higher density of the shown magnetic field lines indicates here a qualitatively higher magnetic field strength. The mode of representation chosen in the FIGS. 2a-c is used analogously also for the following embodiment examples.

In the embodiment example of FIG. 2a, the main sensitivity direction H1 of the magneto-resistive elements 13 of the first sensor line 12, as in the embodiment example of FIG. 1, is oriented parallel to the transport direction T and the main sensitivity direction H2 of the magneto-resistive elements 15 of the second sensor line 14 perpendicular to the transport direction T, but parallel to the transport plane of the document of value 1. The magnetization directions of the two magnetization sections A, B are opposite to those of FIG. 1. The first magnetization section A, whose magnetic field strength again is greater than the coercive field strength of the high-coercive magnetic areas and of the low-coercive magnetic areas, magnetizes the high- and low-coercive magnetic areas in a magnetization direction perpendicular to the transport direction T, but parallel to the transport plane. The second magnetization section B, whose magnetic field strength lies between the two coercive field strengths, magnetizes the low-coercive magnetic areas in a magnetization direction parallel to the transport direction T. From a document of value 1 magnetized according to FIG. 2a, the magneto-resistive elements 13 of the first sensor line 12 selectively detect the low-coercive magnetic areas, while the magneto-resistive elements 15 of the second sensor line 14 selectively detect the high-coercive magnetic areas. The order of the two sensor lines 12, 14 along the transport path S is arbitrarily interchangeable.

Instead of the magneto-resistive elements with main sensitivity direction parallel to the transport direction T, there can be alternatively used magneto-resistive elements with a main sensitivity direction which is oriented perpendicular to the transport plane of the document of value 1. Since the magnetization of a magnetic area also leads to a magnetic field in the immediate surroundings of the respective magnetic area, the magnetization of a magnetic area magnetized parallel to the transport direction T can also be detected on the basis of the magnetic field caused by this magnetic area in its immediate environment perpendicular to the transport plane. Starting out from the embodiment example of FIG. 2a, the sensor line 12 therefore may alternatively have magneto-resistive elements 13, whose main sensitivity direction is oriented perpendicular to the transport plane, as it is shown in the embodiment example of FIG. 2b. Also in this embodiment example, both the order of the two sensor lines 12, 14 along the transport path S and the magnetization directions of the magnetization sections A and B are arbitrarily interchangeable. Also in this case, the magneto-resistive elements 13 of the first sensor line 12 selectively detect from a security element 2 magnetized according to FIG. 2b the high-coercive magnetic areas, while the magneto-resistive elements 15 of the second sensor line 14 selectively detect the low-coercive magnetic areas.

In the embodiment of FIG. 2c, both the magnetization directions of the magnetization sections A and B and the main sensitivity directions H1, H2 of the magneto-resistive elements 13, 15 of the sensor lines 12, 14 extend obliquely to the transport direction T. The magnetization direction of the first magnetization section A, whose magnetic field strength again is greater than the coercive field strengths of the high-coercive magnetic areas and of the low-coercive magnetic areas, is oriented parallel to the main sensitivity direction H1 of the magneto-resistive elements 13 of the first sensor line 12. The magnetization direction of the second magnetization section B is chosen to be extending perpendicular to the magnetization direction of the first magnetization section A, the magnetic field strength of the second magnetization section B again lying between the two coercive field strengths. The main sensitivity direction H2 of the magneto-resistive elements 15 of the second sensor line 14 is chosen to be oriented parallel to the magnetization direction of the second magnetization section B, and thus perpendicular to the main sensitivity direction H1. The magneto-resistive elements 13 of the first sensor line 12 selectively detect the high-coercive magnetic areas, while the magneto-resistive elements 15 of the second sensor line 14 selectively detect the low-coercive magnetic areas. The angle which the magnetic field of one of the two magnetization sections A, B encloses with the transport direction T of the document of value 1 can be chosen arbitrarily. The angle of the magnetic field of the other of the two magnetization sections A, B is chosen to be perpendicular thereto, both magnetization directions preferably lying in the transport plane of the document of value 1. Also in this embodiment example, the order of the two sensor lines 12, 14 along the transport path S is arbitrarily interchangeable.

Figures 2D, 2E:
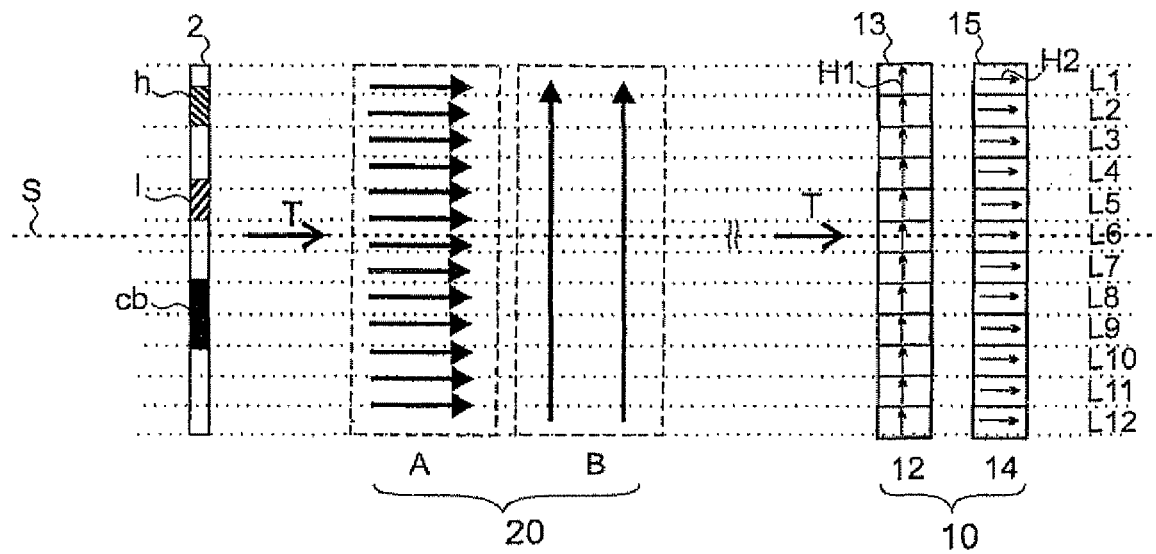
FIGS. 2d-e show schematic representation of a further embodiment example, magnetically coded security element and table for ascertaining the magnetic coding.

In the embodiment example of FIG. 2d, the first and second magnetization section A, B provide magnetic fields analogous to the embodiment example of FIG. 1. Unlike in FIG. 1, the main sensitivity direction H1 of the magneto-resistive elements 13 of the first sensor line 12 in this embodiment extends perpendicular to the transport direction T, and the main sensitivity direction H2 of the magneto-resistive elements 15 of the second sensor line 14 parallel to the transport direction T. The magneto-resistive elements 13 of the first sensor line 12 selectively detect the low-coercive magnetic areas, while the magneto-resistive elements 15 of the second sensor line 14 selectively detect the high-coercive magnetic areas. Altogether, in the shown magnetic sensor 10 there are provided twelve measuring tracks L1-L12, for which in each of the two sensor lines 12, 14 there is provided a respective magneto-resistive element 13, 15. In the shown example, a document of value 1 having a security element 2 is checked, which contains one individual high-coercive magnetic area h, one individual low-coercive magnetic area 1 and one combined magnetic area cb in which a high-coercive magnetic area h and a low-coercive magnet area 1 are arranged in the same area on the security element 2. In the combined magnetic area, the high-coercive and the low-coercive magnetic area can be arranged e.g. one above the other, or a mixture of the differently coercive magnetic materials may be contained therein. From this security element 2, only the magneto-resistive elements 13 of the measuring tracks L5, L8 and L9 of the sensor line 12 detect a magnetic signal which lies above a predetermined threshold value. Of the second sensor line 14, only the magneto-resistive elements 15 of the measuring tracks L2, L8 and L9 detect a magnetic signal which lies above a predetermined threshold value.

In FIG. 2e there is shown a table with the results of a signal evaluation, which the magnetic signals of the individual measuring tracks L1-L12 of the sensor lines 12, 14 were subjected to. Here, "0" represents a magnetic signal which lies below the predetermined threshold value and "1" a magnetic signal which meets or exceeds the predetermined threshold value. Alternatively to the comparison with predetermined threshold values, the magnetic signals, of course, can also be processed using other evaluation methods. In the measuring track L2 only the magneto-resistive element 13 of the first sensor line 12 indicates the presence of an (l-)magnetic area (signature "0, 1"). In the measuring track L5 only the magneto-resistive element 15 of the second sensor line 14 indicates the presence of an (l-)magnetic area (signature "1, 0"). In contrast, in the measuring tracks L8 and L9 the corresponding magneto-resistive elements 13, 15 of both sensor lines 12, 14 indicate the presence of an h- or l-magnetic area, respectively. The measuring tracks L8 and L9 thus have a signature "1, 1" indicating the presence of a combined magnetic area cb, which contains both high-coercive and low-coercive magnetic material.

Figure 3A:
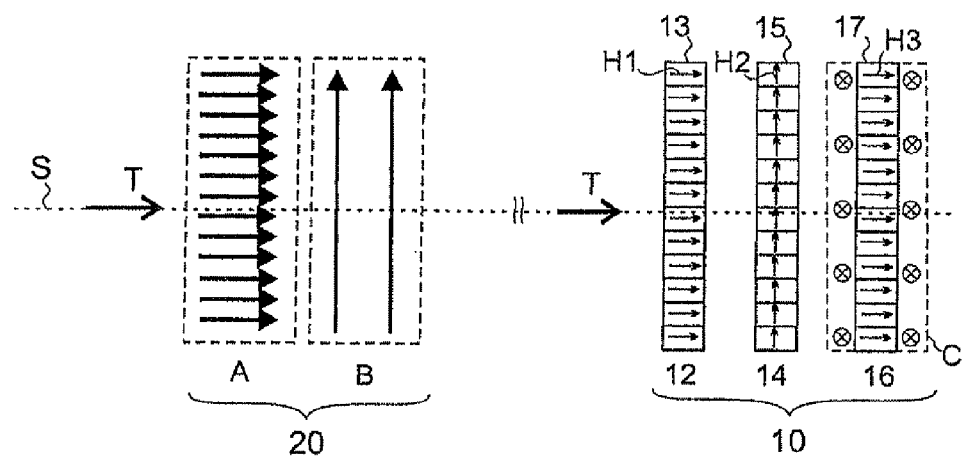
FIGS. 3a-b show schematic representation of two further embodiment examples in which there is additionally used a third sensor line.

In the embodiment example of FIG. 3a, the magnetic sensor 10 has, apart from the two sensor lines 12, 14, an additional third sensor line 16 with several magneto-resistive elements 17 of a third main sensitivity direction H3, which in the shown example is oriented parallel to the main sensitivity direction H1 of the magneto-resistive elements 13 of the first sensor line 12. The third sensor line 16 is arranged in a further magnetization section C, which magnetizes, at the time of the detection by the sensor line 16, the document of value 1 transported past. The magnetization direction of the third magnetization section C is oriented perpendicular to the main sensitivity direction of the magneto-resistive elements 17, which are configured as GMR, AMR, TMR, SdT or spin-valve elements. The further magnetization section C can be produced e.g. by a further magnet or by a current-carrying conductor which is arranged in close proximity to the sensor line 16. The sensor lines 12, 14 lie outside the further magnetization section C. In the example shown in FIG. 3a, the magnetization direction of the further magnetization section C is oriented perpendicular to the magnetization directions of the magnetization sections A and B. Since the document of value 1, during the detection by the sensor line 16, is subjected to the magnetic field of the further magnetization section C, the further magnetization section C makes it possible that with the help of the third sensor line there can also be detected magnetic material of low remanence, e.g. soft-magnetic material. The magnetic sensor 10 of FIG. 3 can therefore advantageously detect both permanently magnetized, e.g. hard-magnetic materials (using the sensor lines 12, 14 and 16), and also materials of low remanence, e.g. soft-magnetic material (using the sensor line 16). For magnetizing the soft-magnetic material, for the third magnetization section C there is used for example a further magnetic field strength of at least 16 kA/m. Starting out from FIG. 3a, the third main sensitivity direction H3 of the magneto-resistive elements 17 of the sensor line 16 can be alternatively chosen to be perpendicular to the transport plane and the further magnetization direction of the further magnetization section C to be parallel to the transport direction T, so that the further magnetization direction is oriented parallel to the first magnetization direction of the first magnetization section A.

Figure 3B:
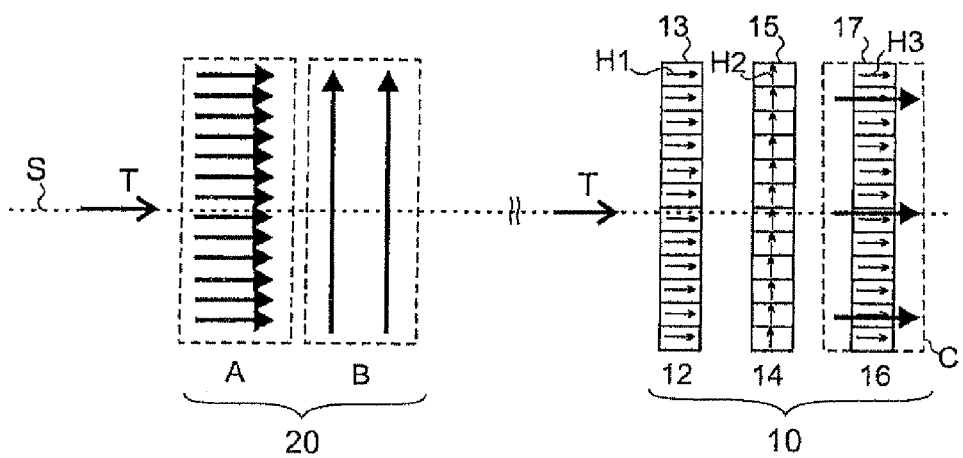

FIG. 3b shows a further embodiment example, in which, unlike the embodiment example represented in FIG. 3a, the third sensor line 16 has conventional magneto-resistance elements 17 which function on the basis of the general magneto-resistance. The sensor lines 13, 15 can have e.g. GMR, AMR, TMR, SdT or spin-valve elements. The magnetization direction of the further magnetization section C, in the case of conventional magneto-resistance elements 17 is preferably chosen parallel to the main sensitivity direction H3 thereof. In the shown example, the magnetization direction of the further magnetization section C is oriented parallel to the transport direction T. Alternatively, the magnetization direction of the further magnetization section C and the third main sensitivity direction H3 of the magneto-resistive elements 17 can also be chosen perpendicular to the transport plane. In all embodiment examples stated with respect to the FIGS. 3a, 3b, the main sensitivity direction H1 of the magneto-resistive elements 13 can alternatively be chosen perpendicular to the transport plane. Furthermore, in all these embodiment examples, the order of the sensor lines 12, 14, 16 along the transport path S is arbitrary and the magnetization directions of the magnetization sections A and B can be interchanged. For the further magnetization section C there is used for example a further magnetic field strength of at least 16 kA/m, by which the soft-magnetic material is magnetized and the conventional magneto-resistance elements are magnetically biased.

Figure 4:
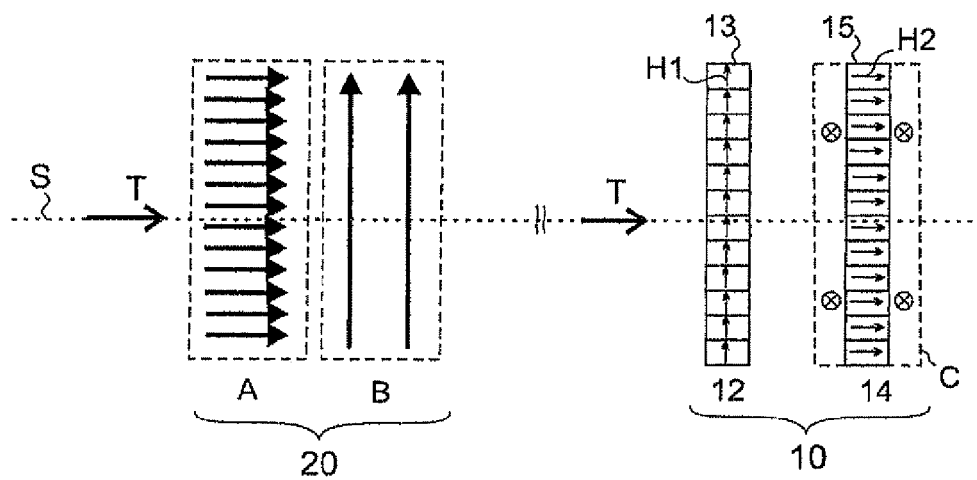
FIG. 4 shows schematic representation of a further embodiment example having an additional magnetization section in the detection area of one of the two sensor lines.

Unlike the embodiment examples of the FIGS. 2a-d and 3a-b, in the embodiment example of FIG. 4 there is now provided in close proximity to the second sensor line 14 a further magnetization section C which magnetizes, at the time of the detection by the second sensor line 14, the document of value 1 transported past. The magnetization direction of the further magnetization section C in this example is oriented perpendicular to the transport plane and thus also perpendicular to the main sensitivity direction H2 of the magneto-resistive elements 15, which in this example are configured as GMR, AMR, TMR, SdT or spin-valve elements. Analogously to the preceding examples, the sensor line 12 selectively detects low-coercive magnetic areas, while the sensor line 14 selectively detects high-coercive magnetic areas. The magnetic field of the third magnetization section C furthermore leads to the magnetization of soft-magnetic magnetic material which may be contained on or in the document of value 1 transported past. With the help of the sensor line 14 there can thus also be detected the magnetization of soft-magnetic material of the document of value 1 in the magnetic field. The sensor line 14 thus provides both magnetic signals of the hard-magnetic, high-coercive magnetic areas and magnetic signals of soft-magnetic magnetic material, if the respective document of value 1 has such. If the document of value has hard- and soft-magnetic magnetic materials, however, these are usually arranged in different areas of the document of value 1, e.g. hard-magnetic material in a security thread and soft-magnetic material in the printing ink. The magnetic signals of the sensor line 14 can then be assigned, on the basis of their respective place of detection on the document of value, to the hard- or the soft-magnetic magnetic material.

In the example of FIG. 4, the further magnetic field strength of the other magnetization section C is chosen such that it lies below the coercive field strength of the low-coercive magnetic areas of the document of value 1. Therefore, in this example the magnetization section C does not cause a magnetic reversal of the low-coercive magnetic areas. Alternative to FIG. 4, the main sensitivity direction of the second sensor line 14 can also be oriented perpendicular to the transport plane and the magnetization direction of the third magnetization section C, in which there is arranged the second sensor line, be oriented parallel to the transport direction T. In the embodiment examples stated with respect to FIG. 4, the order of the sensor lines 12 and 14 along the transport path S can be chosen arbitrarily and the magnetization directions of the magnetization sections A and B can be interchanged with each other.

Figure 5:
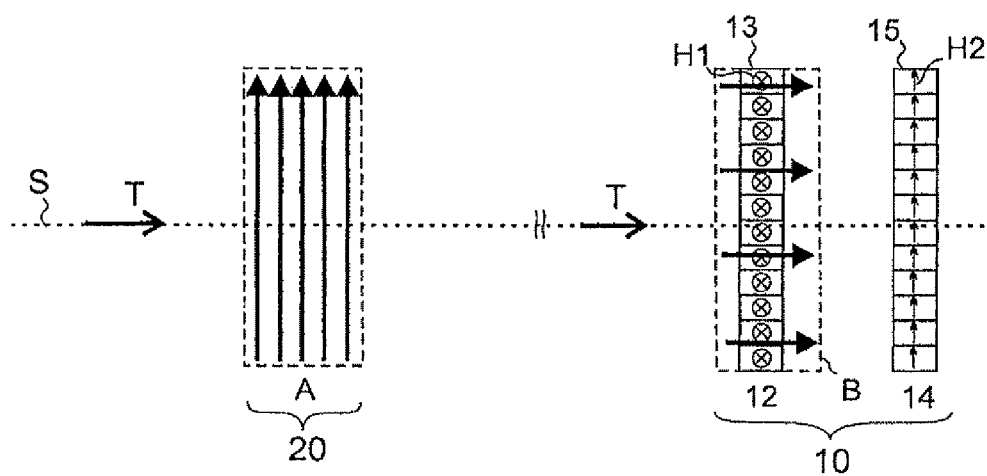
FIG. 5 shows schematic representation of a further embodiment example in which the detection area of a sensor line lies in the second magnetization section.

In the embodiment example of FIG. 5, the magnetization device 20 provides only the first magnetization section A, while the second magnetization section B is provided only in the magnetic sensor 10 in the area of the first sensor line 12 which is arranged in the second magnetization section B. The second magnetization section B causes a magnetization of the document of value 1 transported past. The magnetization of the low-coercive magnetic areas, which were oriented by the first magnetization section A, is oriented parallel to the transport direction T by the second magnetization section B. The turning of the magnetization is effected here on a relatively short time scale, so that the low-coercive magnetic areas at the time of their detection by the first sensor line 12 are substantially already magnetically reversed. The first sensor line 12 therefore selectively detects the low-coercive magnetic areas, while the second sensor line 14 selectively detects the high-coercive magnetic areas, whose magnetization remains unchanged by the magnetic field of the second magnetization section B. The magnetic field of the second magnetization section B furthermore leads to the magnetization of soft-magnetic magnetic material which may be contained on or in the document of value 1 transported past. With the help of the sensor line 12 there can thus also be detected the magnetization of soft-magnetic material of the document of value 1 in the magnetic field.

The invention claimed is:

1. A magnetic sensor for checking a document of value, comprising:
   a first sensor line having several magneto-sensitive elements with a first main sensitivity direction, and
   a second sensor line which has several magneto-sensitive elements with a second main sensitivity direction which is different from the first main sensitivity direction,
   wherein the magneto-sensitive elements of the first sensor line and the magneto-sensitive elements of the second sensor line are arranged along a line extending transverse to the transport direction of the document of value.

2. The magnetic sensor according to claim 1, wherein the first main sensitivity direction is oriented substantially perpendicular to the second main sensitivity direction.

3. The magnetic sensor according to claim 1, wherein the magneto-sensitive elements of the first and of the second sensor line are configured as magneto-resistive elements.

4. The magnetic sensor according to claim 1, wherein the magneto-sensitive elements of the first and of the second sensor line are configured as conventional magneto-resistance elements or as inductive elements.

5. The magnetic sensor according to claim 1, wherein the magnetic sensor has a third sensor line which has several magneto-sensitive elements with a third main sensitivity direction, wherein the third main sensitivity direction is oriented either substantially parallel to the first or to the second main sensitivity direction or is oriented substantially perpendicular to the first and perpendicular to the second main sensitivity direction.

6. The magnetic sensor according to claim 1, wherein the magnetic sensor is configured to check a document of value which has at least one first magnetic area having a first coercive field strength and at least one second magnetic area having a second coercive field strength, wherein the first coercive field strength is greater than the second coercive field strength, and wherein, upon the checking of the document of value, by means of the first or of the second sensor line signals of the at least one first magnetic area are selectively detectable and wherein by means of the other of the said sensor lines magnetic signals of the at least one second magnetic area are selectively detectable.

7. An apparatus for checking a document of value, comprising
   a transport system for transporting the document of value in a transport direction along a transport path, the document of value spanning a transport plane, and
   a first magnetization section for magnetizing the document of value in a first magnetization direction and a second magnetization section for magnetizing the document of value in a second magnetization direction, the second magnetization section being arranged, along the transport path after the first magnetization section, and
   a magnetic sensor as recited in claim 1.

8. The apparatus according to claim 7, wherein the first magnetization section has a first magnetic field strength and the second magnetization section a second magnetic field strength, the first magnetic field strength being greater than the second magnetic field strength.

9. The apparatus according to claim 7, wherein the first magnetization section has a first magnetic field strength which is greater than a first and second coercive field strength and the second magnetization section has a second magnetic field strength which is smaller than a first coercive field strength but greater than a second coercive field strength.

10. The apparatus according to claim 7, wherein the first magnetization direction and the second magnetization direction are oriented substantially perpendicular to each other, the first or the second magnetization directions being oriented substantially parallel to the transport direction of the document of value.

11. The apparatus according to claim 7, wherein a first or a second of two main sensitivity directions is oriented substantially parallel to the transport plane and substantially perpendicular to the transport direction, and the other of said main sensitivity directions is oriented substantially parallel to the transport direction or substantially perpendicular to the transport plane.

12. The apparatus according to claim 7, wherein a first or a second of two main sensitivity directions is oriented substantially parallel or antiparallel to the first or to the second magnetization direction and the other of said main sensitivity directions is oriented either substantially parallel or antiparallel to the other magnetization direction or is oriented substantially perpendicular to the first and to the second magnetization direction.

13. The apparatus according to claim 7, including a magnetization device providing at least the first magnetization section, the magnetization device being arranged, along the transport path of the document of value before the magnetic sensor and spatially separated from the magnetic sensor.

14. The apparatus according to claim 7, wherein the magnetic sensor has a further magnetization section which is configured to magnetize the document of value in a further magnetization direction, the further magnetization section being configured to magnetize the document of value during the detection of the document of value by the first, by the second or by a third sensor line.

15. The apparatus according to claim 14, wherein the further magnetization direction is oriented substantially parallel or antiparallel to the first or to the second magnetization direction or substantially perpendicular to the first and to the second magnetization direction.

16. The apparatus according to claim 7, wherein the first or the second sensor line is arranged in the second magnetization section, a main sensitivity direction of said first or second sensor line being oriented substantially perpendicular to the second magnetization direction of the second magnetization section.

17. A method for checking a document of value which has at least a first magnetic area with a first coercive field strength and at least a second magnetic area with a second coercive field strength, wherein the first coercive field strength is greater than the second coercive field strength, comprising the steps:
transporting the document of value in a transport direction along a transport path, wherein the document of value is transported through a first magnetization section and then through a second magnetization section, and
detecting magnetic signals of the document of value by a magnetic sensor, which has a first and a second sensor line,
wherein by one of the first or second sensor lines there are selectively detected magnetic signals of the at least one first magnetic area, and by means of the other of the said sensor lines there are selectively detected magnetic signals of the at least one second magnetic area.

18. The method according to claim 17, wherein the checking of the document of value is carried out by a magnetic sensor as recited in claim 1 or an apparatus as recited in claim 7.

19. The magnetic sensor according to claim 1, wherein the magneto-sensitive elements of the first sensor line and the magneto-sensitive elements of the second sensor line are arranged within each sensor line immediately adjacent to each other such that no gaps or minimal gaps are present between the magneto-sensitive elements.

20. The magnetic sensor according to claim 1, wherein the magnetic sensor has a further magnetization section which is configured to magnetize the document of value in a further magnetization direction, the further magnetization section being configured to magnetize the document of value during the detection of the document of value by the first, by the second or by a third sensor line.

21. The apparatus according to claim 7, wherein the magnetic sensor has a third sensor line which has several magneto-sensitive elements with a third main sensitivity direction, wherein the third main sensitivity direction is oriented either substantially parallel to the first or to the second main sensitivity direction or is oriented substantially perpendicular to the first and perpendicular to the second main sensitivity direction.

* * * * *